(12) United States Patent
Koizumi et al.

(10) Patent No.: US 9,401,478 B2
(45) Date of Patent: Jul. 26, 2016

(54) METHOD FOR MANUFACTURING TRANSISTOR AND TRANSISTOR

(71) Applicant: NIKON CORPORATION, Tokyo (JP)

(72) Inventors: Shohei Koizumi, Atsugi (JP); Takashi Sugizaki, Yokohama (JP); Kenji Miyamoto, Yokohama (JP)

(73) Assignee: NIKON CORPORATION, Tokyo (JP)

( * ) Notice: Subject to any disclaimer, the term of this patent is extended or adjusted under 35 U.S.C. 154(b) by 33 days.

(21) Appl. No.: 14/178,651

(22) Filed: Feb. 12, 2014

(65) Prior Publication Data

US 2014/0183506 A1    Jul. 3, 2014

Related U.S. Application Data

(63) Continuation of application No. PCT/JP2012/069973, filed on Aug. 6, 2012.

(30) Foreign Application Priority Data

Aug. 15, 2011  (JP) ................................ 2011-177424

(51) Int. Cl.
    *H01L 51/00*    (2006.01)
    *H01L 51/10*    (2006.01)
    *H01L 51/05*    (2006.01)

(52) U.S. Cl.
    CPC ........ *H01L 51/0021* (2013.01); *H01L 51/0545* (2013.01); *H01L 51/0558* (2013.01); *H01L 51/105* (2013.01)

(58) Field of Classification Search
    CPC .............. H01L 51/0021; H01L 51/105; H01L 51/0545; H01L 51/0512
    See application file for complete search history.

(56) References Cited

U.S. PATENT DOCUMENTS

| 7,361,594 B2* | 4/2008 | Kawase et al. ................. 438/678 |
| 2005/0151195 A1 | 7/2005 | Kawase et al. |
| 2008/0018816 A1 | 1/2008 | Hattori et al. |

FOREIGN PATENT DOCUMENTS

| CN | 101109879 | 1/2008 |
| JP | 2005-150640 | 6/2005 |
| JP | 2009-111000 | 5/2009 |

OTHER PUBLICATIONS

English Machine translation of JP2009111000 A.*

(Continued)

*Primary Examiner* — Matthew W Such
*Assistant Examiner* — Scott Stowe

(57) ABSTRACT

A method for manufacturing a transistor includes: forming a base film for supporting a catalyst for electroless plating; forming a resist layer having an opening portion corresponding to source and drain electrodes onto the base film; causing the base film within the opening portion to support the catalyst for electroless plating and performing a first electroless plating; removing the resist layer; performing a second electroless plating on a surface of an electrode which is formed by the first electroless plating and forming the source and drain electrodes; and forming a semiconductor layer in contact with surfaces of the source and drain electrodes, the surfaces facing each other, wherein an energy level difference between a work function of a material which is used for the second electroless plating and an energy level of a molecular orbital which is used for electron transfer in a material of the semiconductor layer is less than an energy level difference between a work function of a material which is used for the first electroless plating and the energy level of the molecular orbital.

8 Claims, 13 Drawing Sheets

(56) References Cited

OTHER PUBLICATIONS

International Search Report mailed Oct. 2, 2012, in corresponding International Application No. PCT/JP2012/069973.
PCT Written Opinion of the International Searching Authority mailed Oct. 2, 2012 in corresponding International Patent Application No. PCT/JP2012/069973.
Kumaki et al., "Reducing the contact resistance of bottom-contact pentacene thin-film transistors by employing a $MoO_x$ carrier injection layer", Applied Physics Letters, vol. 92, 2008, 4 pp.
Marmont et al., "Improving charge injection in organic thin-film transistors with thiol-based self-assembled monolayers", Organic Electronics, vol. 9, 2008, pp. 419-424.
Japanese Office Action dated Nov. 4, 2015 from corresponding Japanese Patent Application No. 2013-528968, 5 pages.
Chinese Office Action dated Nov. 2, 2015 from corresponding Chinese Patent Application No. 201280037825.X, 16 pages.
Chinese Office Action dated May 16, 2016 in corresponding Chinese Patent Application No. 201280037825.X.

* cited by examiner

METHOD FOR MANUFACTURING TRANSISTOR AND TRANSISTOR

CROSS-REFERENCE TO RELATED APPLICATION

This is a Continuation application of International Application No. PCT/JP2012/069973, filed on Aug. 6, 2012, which claims priority on Japanese Patent Application No. 2011-177424, filed on Aug. 15, 2011. The contents of the aforementioned applications are incorporated herein by reference.

BACKGROUND

1. Field of the Invention

The present invention relates to a method for manufacturing a transistor and a transistor.

2. Background

An organic transistor can be manufactured at low temperatures compared to an inorganic silicon thin film transistor of the related art and has advantages such as a capability of being formed onto a flexible substrate using a resin material and thereby formed into an organic transistor having flexibility or capable of being formed by a low-cost solution process which is suitable for size increase. Therefore, research has been actively conducted as the core of the next-generation flexible electronics.

The structure of an organic thin film transistor is generally classified into a bottom contact type or a top contact type. Of these two types, the bottom contact thin film transistor is obtained by forming an organic semiconductor layer onto a substrate on which a circuit pattern is formed in advance and therefore has an advantage that the organic semiconductor layer is not degraded by physical or chemical stress associated with electrode formation.

On the other hand, in the bottom contact organic thin film transistor, contact resistance (Schottky resistance) between an organic semiconductor and a metal wiring arises due to the difference between the work function of a metal material which constitutes an electrode and the HOMO (Highest Occupied Molecular Orbital) (or LUMO (Lowest Unoccupied Molecular Orbital)) level of the organic semiconductor, and therefore there is a problem in that the performance of the bottom contact organic thin film transistor is inferior to that of the top contact organic thin film transistor.

In a case where a gold wiring is formed on an insulator layer by evaporation, sputtering, or the like, a titanium layer or a chromium layer is required as an adhesive layer. Because titanium or chromium has a small work function, there is a problem in that the charge injection characteristics into an organic semiconductor such as pentacene are degraded. In order to solve this problem, D. Kumaki, Appl. Phys. Lett., 92, 013301 (2008) proposes a configuration which employs a laminate structure of a metal layer and a metal oxide layer having superior charge injection characteristics into an organic semiconductor, for source and drain electrodes such that the charge injection barrier between the electrode layer and the organic semiconductor layer is reduced.

In addition, P. Marmont et al., Organic Electronics (2008), doi: 10.1016/j.orgel. 2008.01.004 discloses a TFT of which an Au (gold) electrode is treated by SAMs (Self Assembled Monolayers) such as decanethiol (DT), perfluorodecanethiol (PFDT), or perfluorohexanethiol (PFHT) so as to change the work function and the electron injection from the electrode is improved.

SUMMARY

However, because the above-described methods use a vacuum process when the metal oxide layer is formed or use a costly SAMs material, the methods are not suitable for increasing the size of a substrate or mass production of a transistor.

An object of an aspect of the present invention is to provide a method for manufacturing a transistor having a reduced contact resistance between the organic semiconductor and the electrode and having superior productivity. In addition, an object of an aspect of the present invention is to provide a transistor having a reduced contact resistance between the organic semiconductor and the electrode and having superior productivity.

A method for manufacturing a transistor according to an aspect of the present invention includes: forming a base film for supporting a catalyst for electroless plating; forming a resist layer having an opening portion corresponding to a source electrode and a drain electrode onto the base film; causing the base film within the opening portion to support the catalyst for electroless plating and performing a first electroless plating; removing the resist layer; performing a second electroless plating on a surface of an electrode which is formed by the first electroless plating and forming a source electrode and a drain electrode; and forming a semiconductor layer in contact with a surface of the source electrode and a surface of the drain electrode, the surfaces facing each other, wherein an energy level difference between a work function of a metal material which is used for the second electroless plating and an energy level of a molecular orbital which is used for electron transfer in a formation material of the semiconductor layer is less than an energy level difference between a work function of a metal material which is used for the first electroless plating and the energy level of the molecular orbital.

Where, "an energy level of a molecular orbital which is used for electron transfer in a formation material of a semiconductor layer" is an energy level of HOMO in the case that the semiconductor layer is a p-type semiconductor, and is an energy level of LUMO in the case that the semiconductor layer is an n-type semiconductor.

In addition, a transistor according to an aspect of the present invention includes: a source electrode and a drain electrode; a gate electrode that is provided corresponding to a channel between the source electrode and the drain electrode; and a semiconductor layer that is provided in contact with a surface of the source electrode and a surface of the drain electrode, the surfaces facing each other, wherein: the source electrode has a first electrode and a second electrode that is provided on at least part of a surface of the first electrode; the drain electrode has a third electrode and a fourth electrode that is provided on at least part of a surface of the third electrode; an energy level difference between a work function of a formation material of the second electrode and an energy level of a molecular orbital which is used for electron transfer in a formation material of the semiconductor layer is less than an energy level difference between a work function of a formation material of the first electrode and the energy level of the molecular orbital; and an energy level difference between a work function of a formation material of the fourth electrode and an energy level of a molecular orbital which is used for electron transfer in a formation material of the semiconductor layer is less than an energy level difference between a work function of a formation material of the third electrode and the energy level of the molecular orbital.

According to an aspect of the present invention, it is possible to provide a method for manufacturing an organic transistor having a reduced contact resistance between the organic semiconductor and the electrode and having superior productivity.

DESCRIPTION OF THE EMBODIMENTS

Hereinafter, with reference to FIG. 1 to FIG. 7B, a manufacturing method of an organic transistor according to the present embodiment will be described. Note that, in all the following drawings, the dimensions and ratios of each constituent element and the like are suitably varied for easy understanding of the drawings.

Figure 1:
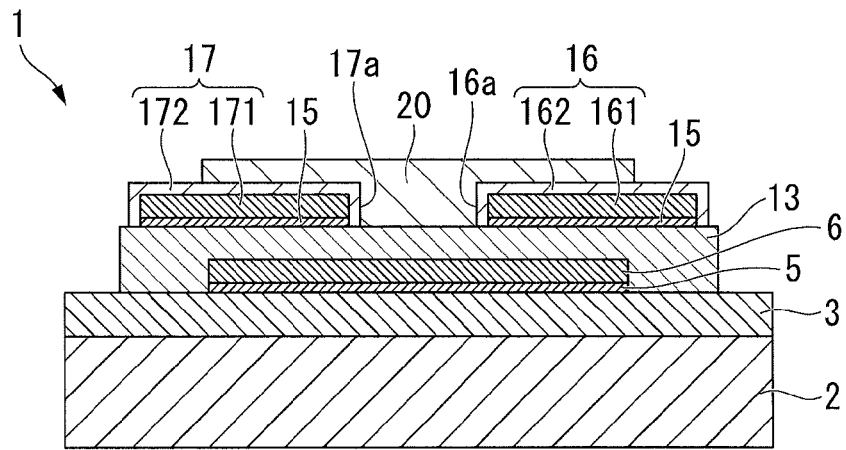
FIG. 1 is a schematic cross-sectional diagram showing an organic transistor manufactured by a manufacturing method of the present embodiment.

FIG. 1 is a schematic cross-sectional diagram showing an organic transistor 1 which is manufactured by a manufacturing method of an organic transistor of the present embodiment. The organic transistor 1 is a so-called bottom contact organic thin film transistor.

The organic transistor 1 includes a substrate 2, parent plating layers 3, 13, catalysts for electroless plating 5, 15, a gate electrode 6, a source electrode 16, a drain electrode 17, and an organic semiconductor layer 20. The parent plating layer (base film) 13 functions as an insulator layer which insulates the gate electrode 6 from the source electrode 16 or the drain electrode 17.

As the substrate 2, both of a substrate having light transmission characteristics and a substrate not having light transmission characteristics can be used. For example, an inorganic material such as glass, quartz glass, or silicon nitride, an organic polymer material (resin) such as acrylic resin, polycarbonate resin, or polyester resin such as PET (polyethylene terephthalate) or PBT (polybutylene terephthalate), or the like can be used.

These materials of the substrate 2 do not form metal bonding with a metallic plating film which is formed as a result of electroless plating. Therefore, in the present embodiment, these materials are treated as a plating resistant material directly onto which a plating film is not easily formed or from which a formed plating film is easily separated. For the same reason, for example, a composite material of the above-described materials or the like can be similarly used as a formation material of the substrate 2 if the composite material or the like is a material from which a plating film is easily separated.

The parent plating layer 3 is formed so as to cover the whole surface of one main surface of the substrate 2. The parent plating layer 3 includes, for example, alumina particles having an average particle size of about 100 nm, 90 nm, 80 nm, 70 nm, 60 nm, 50 nm, 40 nm, 30 nm, 20 nm, 10 nm, or less. As the alumina particles, it is possible to employ a granular shape, a rod-like shape, a feather-like shape, or the like, provided that the average particle size is about 100 nm or less. Where, the "average particle size" is a value which can be obtained by employing a volume average particle size, an area average particle size, a cumulative median diameter (Median diameter), or the like, using a publicly known method such as a dynamic light scattering method as a measurement principle. In addition, in the case that the alumina particles have a variant shape such as the rod-like shape or the feather-like shape, the maximum diameter in one particle (size in a longer direction) is the above-described average particle size, and the size in a shorter direction in one particle shows a smaller value than the above-described average particle size.

In addition, the parent plating layer 3 includes a binder (base material) in which the above-identified alumina particles are dispersed. As the binder material, it is possible to use a photo curable resin, and in particular, to use an ultraviolet curable resin. Examples of such a resin material can be epoxy resin, acrylic resin, acrylic urethane resin, phenol resin, enethiol resin, polysiloxanes, and the like. The following description is described using an example in which the parent plating layer 3 uses an ultraviolet curable resin as a binder.

The catalyst (catalyst for electroless plating) 5 is selectively provided on part of the surface of the parent plating layer 3. The catalyst 5 is a catalyst for reducing metal ions contained in the plating solution for electroless plating, and an example is metal palladium.

The gate electrode 6 is a metal wiring formed on the surface of the catalyst 5 and is formed of a metal deposited on the surface of the catalyst 5 by electroless plating, as described later. Examples of a material of the gate electrode 6 are nickel-phosphorus (NiP) and copper (Cu).

The parent plating layer 13 covers the gate electrode 6 and is selectively provided on the surface of the parent plating layer 3. The parent plating layer 13 which functions as an insulator layer is formed in a thickness of, for example, about several hundred nm. As a formation material of the parent plating layer 13, it is possible to use a formation material similar to that of the parent plating layer 3 described above. The type of alumina particles or a binder contained in the parent plating layer 3 may be the same as or may be different from that contained in the parent plating layer 13. The following description is described using an example in which the parent plating layer 3 and the parent plating layer 13 are different only in thickness, contain the same alumina particles, and use an ultraviolet curable resin as a binder.

The catalyst (catalyst for electroless plating) 15 is selectively provided on part of the surface of the parent plating layer 13. As a formation material of the catalyst 15, it is possible to use a formation material similar to that of the catalyst 5 described above.

The source electrode 16 and the drain electrode 17 are a metal wiring formed on the surface of the catalyst 15. The source electrode 16 includes a first electrode 161 and a second electrode 162 which covers the surface of the first electrode 161. Similarly, the drain electrode 17 includes a third electrode 171 and a fourth electrode 172 which covers the surface of the third electrode 171.

Similar to the gate electrode 6 described above, the first electrode 161 and the third electrode 171 are a metal wiring which is formed by electroless plating. Examples of a material of the first electrode 161 and the third electrode 171 are nickel-phosphorus (NiP) and copper (Cu). The present embodiment is described using an example in which nickel-phosphorus (work function: 5.5 eV) is used as a formation material of the first electrode 161 and the third electrode 171.

The second electrode 162 and the fourth electrode 172 are a metal plating layer which is formed so as to cover the whole of the surfaces of the first electrode 161 and the third electrode 171 not in contact with the catalyst 15. In other words, the second electrode 162 and the fourth electrode 172 are each provided so as to cover side surfaces 16a, 17a (facing surfaces) which face each other of the source electrode 16 and the drain electrode 17.

As a formation material of the second electrode 162 and the fourth electrode 172, a metal material having a work function for easy electron transfer (or hole transfer) with respect to the HOMO/LUMO levels of a formation material of the organic semiconductor layer 20 described later is used. The present embodiment is described using an example in which gold (work function: 5.4 eV) is used as a formation material of the second electrode 162 and the fourth electrode 172.

The organic semiconductor layer 20 is provided on the surface of the parent plating layer 13 between the source electrode 16 and the drain electrode 17 and is formed in contact with the source electrode 16 and the drain electrode 17. In detail, the organic semiconductor layer 20 is provided in contact with the side surface 16a of the source electrode 16 and the side surface 17a of the drain electrode 17 and is in contact with the second electrode 162 and the fourth electrode 172.

As a formation material of the organic semiconductor layer 20, it is possible to use a generally-known organic semiconductor material. For example, it is possible to use a p-type semiconductor such as copper phthalocyanine (CuPc), pentacene, rubrene, tetracene, and P3HT (poly(3-hexylthiophene-2,5-diyl)), or an n-type semiconductor such as fullerenes like $C_{60}$ and perylene derivatives like PTCDI-C8H (N,N'-dioctyl-3,4, 9,10-perylene tetracarboxylic di imide). Among them, soluble pentacene like TIPS pentacene (6,13-Bis(triisopropylsilylethynyl)pentacene) and organic semiconductor polymer like P3HT are soluble in organic solvents like toluene and are capable of forming into the organic semiconductor layer 20 by a wet process. The present embodiment is described using an example in which TIPS pentacene (HOMO level: 5.2 eV) is used as a formation material of the organic semiconductor layer 20.

In the organic transistor 1 described above, because the second electrode 162 and the fourth electrode 172 are formed on the surface of the source electrode 16 and the drain electrode 17, current easily flows between the organic semiconductor layer 20 and the source electrode 16 (or the organic semiconductor layer 20 and the drain electrode 17) at the time of driving, and it is possible to successfully drive the organic transistor 1.

Figure 2A:
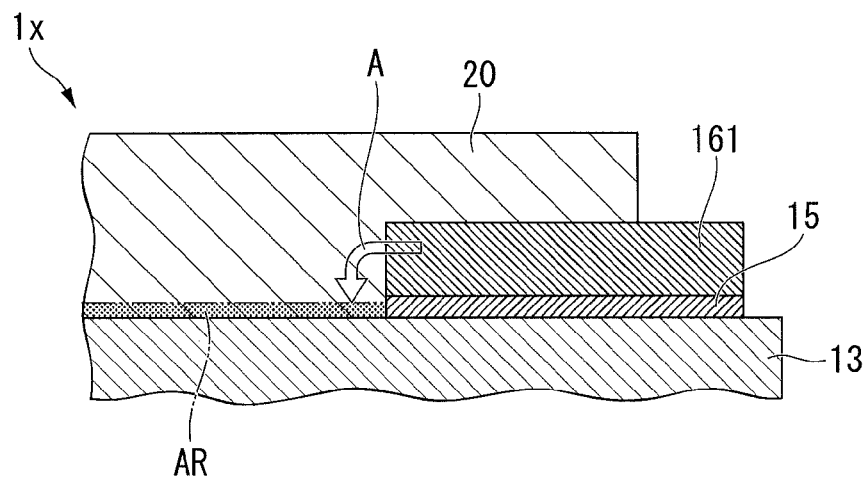
FIG. 2A is a diagram showing a state of driving of the organic transistor manufactured by the manufacturing method of the present embodiment.
Figure 2B:
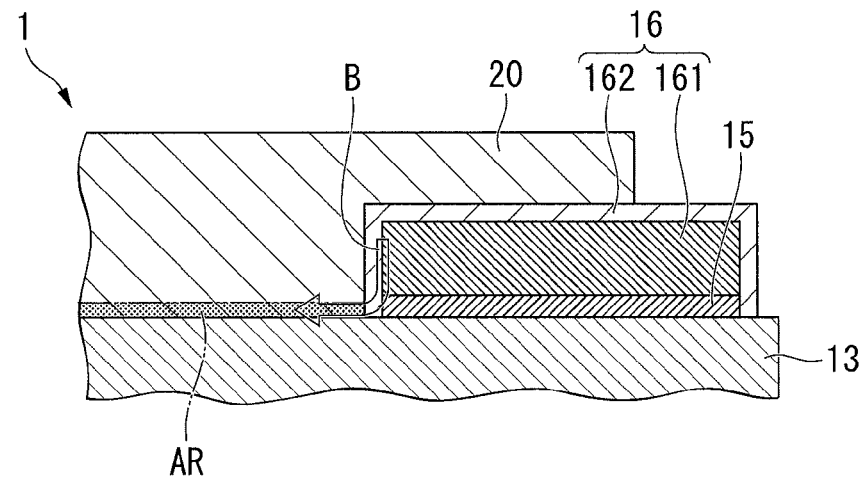
FIG. 2B is a diagram showing a state of driving of the organic transistor manufactured by the manufacturing method of the present embodiment.

FIG. 2A and FIG. 2B are a schematic diagram showing a state of driving of an organic transistor. FIG. 2A is a diagram showing an organic transistor 1x including the same configuration as the organic transistor 1 except for not having the second electrode, and FIG. 2B is a diagram showing the organic transistor 1 manufactured by the manufacturing method of the present embodiment.

First, in the case of the configuration not having the second electrode as the organic transistor 1x shown in FIG. 2A, because a gap (energy level difference) between the HOMO of the organic semiconductor layer 20 and the work function of the first electrode 161 is large, a Schottky resistance arises, and it is difficult for current to flow. Therefore, for example, as is shown in the drawing using an arrow A, current flow which flows the organic semiconductor layer 20 of high resistance is easily formed, and it is difficult to ensure good conduction.

On the other hand, as is shown in FIG. 2B, when voltage is applied to a gate electrode not shown in the drawing in the organic transistor 1, a channel region AR having a thickness of several nm is formed in the organic semiconductor layer 20 in the vicinity of the interface with the parent plating layer 13, which enables conduction between the source electrode 16 and a drain electrode not shown in the drawing. At this time, because the second electrode 162 is formed at the surface of the source electrode 16 using a metal material having a work function for easier electron transfer to and from the formation material of the organic semiconductor layer 20 (with a smaller energy level difference with the HOMO of the organic semiconductor layer 20) than the first electrode 161, and the Schottky resistance is reduced, current favorably flows into the channel region AR via the first electrode 161 and the second electrode 162. In the drawing, current flow is shown using an arrow B. Therefore, it is possible to achieve the organic transistor 1 of high performance.

The organic transistor 1 manufactured by the manufacturing method of the present embodiment has a configuration as described above.

Hereinafter, with reference to FIGS. 3A to 7B, a manufacturing method of the above-described organic transistor 1 will be described.

Figure 3A:
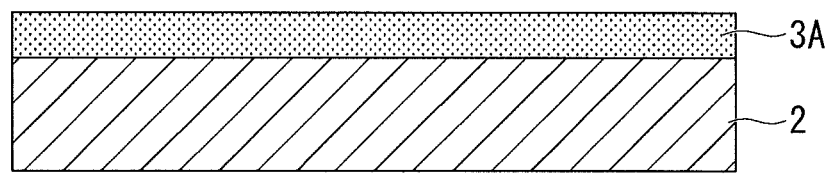
FIG. 3A is a process diagram showing the manufacturing method of the present embodiment.

First, as shown in FIG. 3A, a coating solution in which the above-described alumina particles are uniformly dispersed in the precursor of the above-described transparent resin is coated on the surface of the substrate 2, and a coating film 3A is formed. Examples of a method of coating can be generally-known methods such as spin coating, dip coating, spray coating, roll coating, brush coating, and the printing method like flexographic printing or screen printing.

As a solvent of the coating solution, a polar solvent can be used. Examples of useable solvents are alcohols such as methanol, ethanol, 1-propanol, and 2-propanol (isopropyl alcohol, IPA), ethers such as propylene glycol monomethyl ether acetate (PGMEA), aromatic hydrocarbon such as toluene, nitriles such as acetonitrile, and esters such as acetate ester.

In the case that an ultraviolet curable resin is selected as a transparent resin, a small amount of photopolymerization initiator may be added to the coating solution.

Figure 3B:
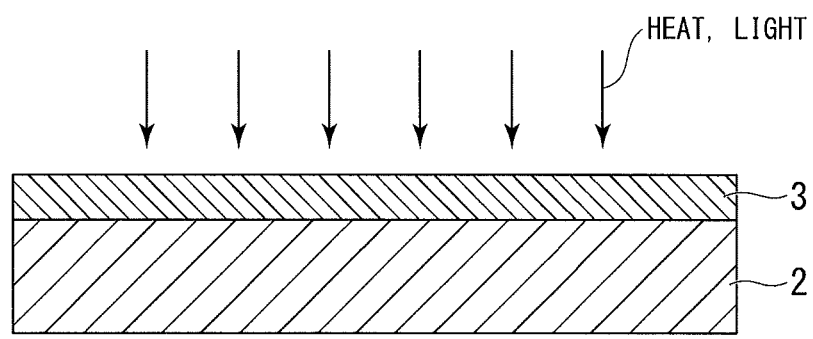
FIG. 3B is a process diagram showing the manufacturing method of the present embodiment.

Next, as is shown in FIG. 3B by performing any one or both of heating and light (ultraviolet light) irradiation, the precursor is cured, and the parent plating layer 3 is formed.

When the particle size of the alumina particles contained in the coating solution is 100 nm or less, because the particle size is smaller than the wavelength of light in a visible light region, there is little scattering of visible light caused by the alumina particles, and the parent plating layer 3 presents high light transmittance. Therefore, in the case of using the substrate 2 for which a material having light transmission characteristics is used, by applying the coating solution onto the whole surface of the substrate 2 and forming the parent plating layer 3, it is possible to maintain the light transmittance of the substrate 2.

In addition, in the case that the particle size of the alumina particles is even smaller (for example, about 20 nm), by suppressing a concentration of alumina particles to a binder (alumina content) to about 5 vol %, it is possible to reduce the surface roughness of the parent plating layer 3 and to prepare a smooth parent prating layer 3. Then, it is possible reduce the thickness of the insulator layer which covers the gate electrode formed on top of the parent plating layer 3, and it is possible to manufacture a transistor having high performance.

When an ultraviolet curable resin is used as the binder in which the alumina particles are dispersed, because it is possible to perform the process of curing of the precursor at room temperature, residual stress tends to not be included. Therefore, for example, in the case that a material having a low elastic modulus is used as the substrate 2, or in the case that a material thin enough to be capable of being rolled up into a roll is used, a problem in that the entirety of the sample is distorted by residual stress can be suppressed.

Note that, in the case that an ultraviolet curable resin is used, heating may be performed for a predetermined length of time after curing reaction by ultraviolet light irradiation to complete the reaction (so-called post baking). Even in this case, because most of the precursor is cured before post baking, residual stress does not easily occur, and it is possible to achieve the advantage of using an ultraviolet curable resin.

Figure 4A:
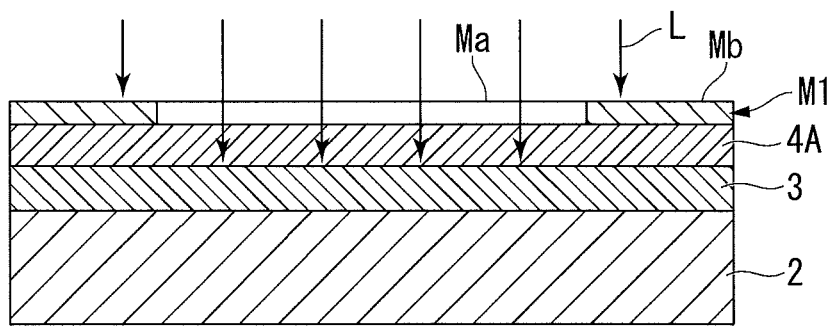
FIG. 4A is a process diagram showing the manufacturing method of the present embodiment.

Next, as is shown in FIG. 4A, by coating a resist material onto the parent plating layer 3 and applying prebaking to this, a resist layer 4A which is not patterned is formed. As the resist material, a positive type photoresist is used here.

Then, the resist layer 4A is irradiated with ultraviolet light L via a mask M1 which includes an opening portion Ma at a position corresponding to a region where a metal wiring is formed and includes a light shielding portion Mb at a region where a metal wiring is not formed, and the resist layer 4A is exposed.

Figure 4B:
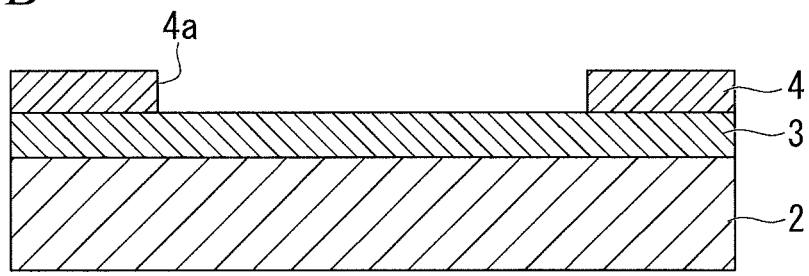
FIG. 4B is a process diagram showing the manufacturing method of the present embodiment.

Next, as is shown in FIG. 4B, by developing with a developer which dissolves the resist layer irradiated with ultraviolet light, a resist layer 4 which is provided with an opening portion 4a is formed.

Figure 4C:
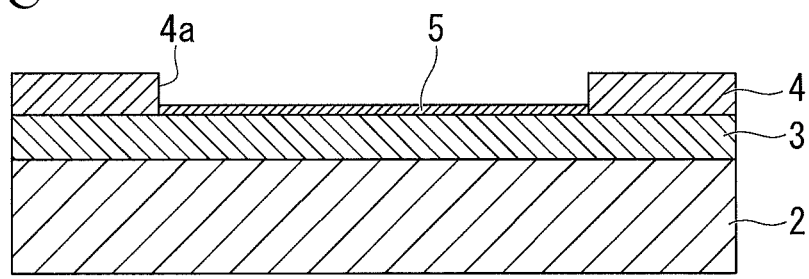
FIG. 4C is a process diagram showing the manufacturing method of the present embodiment.

Next, as is shown in FIG. 4C, the catalyst 5 which is used for electroless plating is added to the parent plating layer 3 which is exposed at the opening portion 4a formed in the resist layer 4. Specifically, by coating of a colloidal solution of divalent palladium salt and divalent tin (Sn) salt, and then immersing in acid or an alkaline solution which is called an accelerator to reduce palladium to zero valence, a catalyst 5 constituted by metal palladium is added.

At this time, it is considered that, because alumina particles having ultrafine unevenness is included in the parent plating layer 3, metal palladium which is a catalyst for plating adheres to this ultrafine unevenness. Thereby, it is considered that binding of the interface between the parent plating layer 3 and the catalyst 5 becomes strong.

Figure 4D:
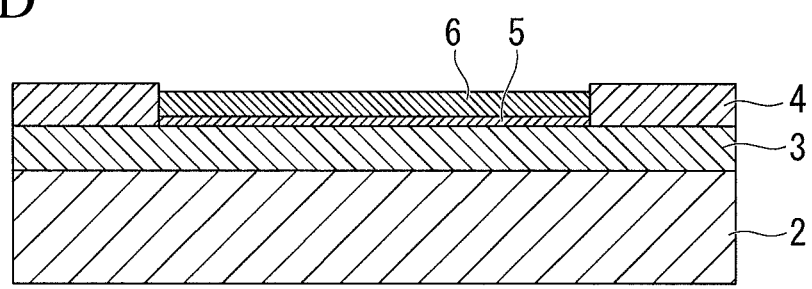
FIG. 4D is a process diagram showing the manufacturing method of the present embodiment.

Next, as is shown in FIG. 4D, by immersion in an electroless plating solution, metal ions dissolved in the electroless plating solution are reduced on and deposited onto the surface of the catalyst 5, and a gate wiring 6 is formed selectively within the opening portion 4a.

Figure 4E:
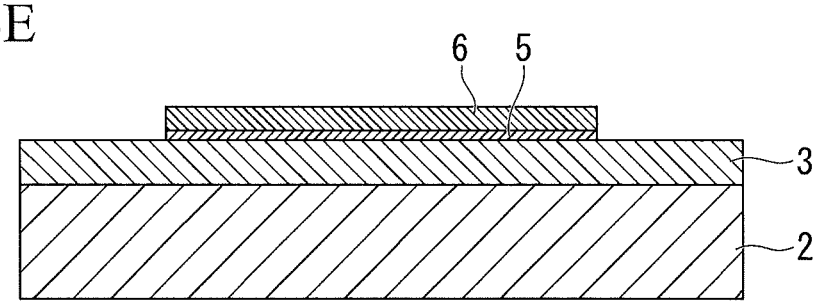
FIG. 4E is a process diagram showing the manufacturing method of the present embodiment.

Next, as is shown in FIG. 4E, after exposing the whole surface of the remaining resist layer with ultraviolet light, the resist layer is removed with a generally-known developer. In this way, the gate wiring 6 is formed.

Figure 5A:
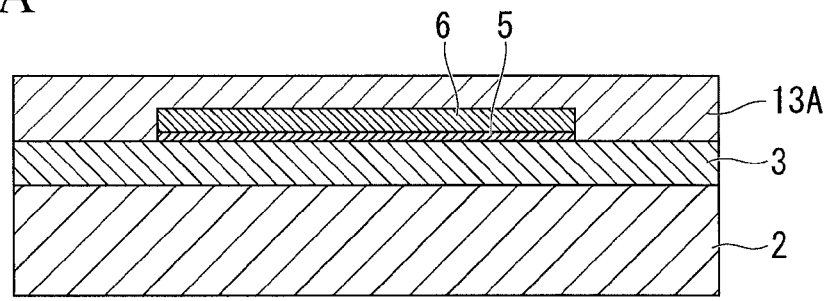
FIG. 5A is a process diagram showing the manufacturing method of the present embodiment.

Next, as is shown in FIG. 5A, a coating solution in which the above-described alumina particles are uniformly dispersed in the precursor of the above-described transparent resin is coated so as to cover the gate wiring 6 and onto the surface of the parent plating layer 3. As a method of coating, it is possible to use the method described above.

As a solvent of the coating solution, a polar solvent similar to the above-described coating solution according to the coating film 3A can be used. In addition, by changing the concentration or the type of the solvent in the coating solution, the whole viscosity of the coating solution is adjusted and the film thickness of a coating film 13A of the coating solution is controlled. In other words, by appropriately selecting the concentration or the type of the solvent of the coating solution, the layer thickness of the parent plating layer which is formed of the coating film 13A is controlled.

For example, when the concentration of the alumina particles contained in the coating solution increases, because the viscosity of the coating solution increases, thick coating of the coating solution becomes possible.

In addition, as a solvent of the coating solution, when a solvent having a relatively high viscosity is selected from a number of solvents, because the coating solution can be suitable for thick coating, it becomes easy to increase the thickness of the coating film 13A, and when a solvent having a relatively low viscosity is selected, because the coating solution can be suitable for thin coating, the coating film 13A becomes thin.

Moreover, when attention is focused on a boiling point of the solvent of the coating solution, because many of the solvents having a low boiling point are a solvent having a relatively low viscosity and many of the solvents having a high boiling point are a solvent having a relatively high viscosity, a solvent may be selected focusing on the boiling point.

In addition, in case of a coating solution using a low boiling point solvent, the coating solution may dry out immediately after coating, and coating unevenness or coating streaks may occur on the surface of the coating film 13A. Therefore, depending on the work environment for coating the coating solution, a solvent of a suitable boiling point may be selected such that coating unevenness or coating streaks does not occur. On the other hand, the solvent can be a solvent having a low boiling point such that the solvent can be easily removed after coating of the coating solution.

These solvents may be used independently, or two or more types may be appropriately mixed and used. For example, by appropriately mixing methanol which is a solvent having a low boiling point and a low viscosity with PGMEA which is a solvent having a high boiling point and a high viscosity and using the mixed solution, it is possible to adjust the balance between the viscosity and the boiling point of the coating solution. Moreover, as necessary, the thickness of the coating film may be increased by recoating.

In the process shown in FIG. 5A, because the parent plating layer which is formed of the coating film 13A is used as an insulator layer of the gate wiring 6, thick coating is performed such that the thickness of the coating film 13A is about several hundred nm.

Figure 5B:
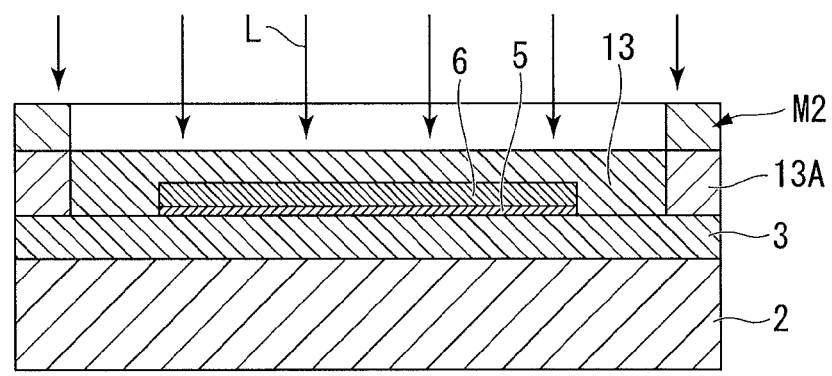
FIG. 5B is a process diagram showing the manufacturing method of the present embodiment.

Next, as is shown in FIG. 5B, the coating film 13A is irradiated with ultraviolet light L via a mask M2 which is provided with an opening portion corresponding to a region where the parent plating layer 13 is formed, to cure the binder, and the parent plating layer 13 is formed.

Figure 5C:
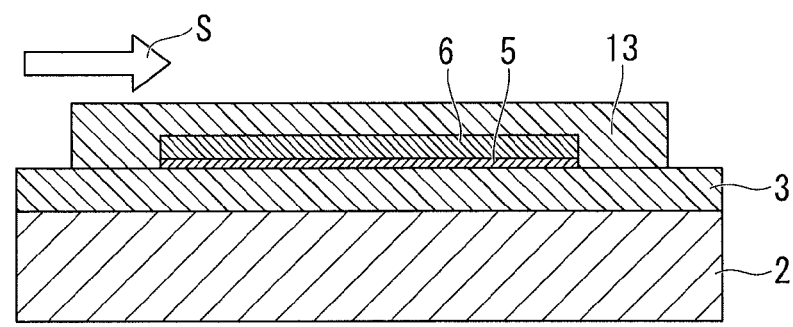
FIG. 5C is a process diagram showing the manufacturing method of the present embodiment.

Next, as is shown in FIG. 5C, by developing with a solvent S which dissolves the coating film, an uncured coating film is removed, and a patterned parent plating layer 13 is formed.

Figure 6A:
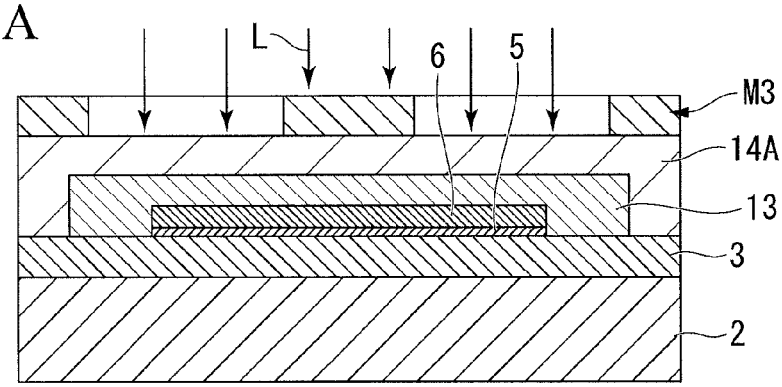
FIG. 6A is a process diagram showing the manufacturing method of the present embodiment.

Next, as is shown in FIG. 6A, by coating a resist material so as to cover the parent plating layer 13 and onto the upper surface of the parent plating layer 3 and applying prebaking to this, a resist layer 14A which is not patterned is formed. As the resist material, a positive type photoresist is used.

Then, the resist layer 14A is irradiated with ultraviolet light L via a mask M3 which is provided with an opening portion corresponding to a region where the source electrode and the drain electrode are formed, and the resist layer 14A is exposed.

Figure 6B:
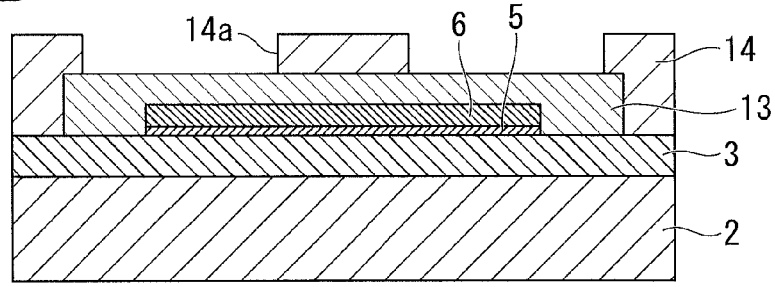
FIG. 6B is a process diagram showing the manufacturing method of the present embodiment.

Next, as is shown in FIG. 6B, by developing with a developer which dissolves the resist layer irradiated with ultraviolet light, a resist layer 14 which is provided with an opening portion 14a is formed.

Figure 6C:
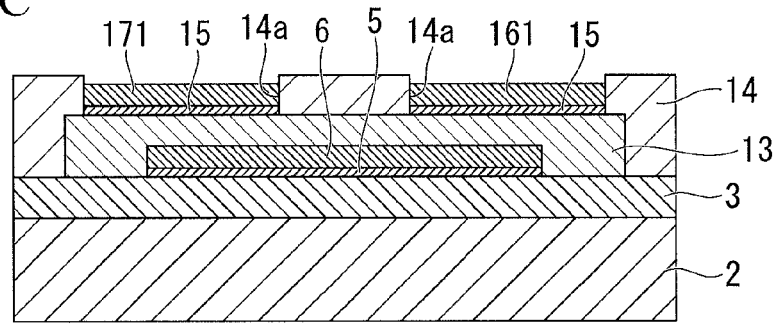
FIG. 6C is a process diagram showing the manufacturing method of the present embodiment.

Next, as is shown in FIG. 6C, by immersing in an electroless plating solution after the catalyst 15 which is used for electroless plating is added to the parent plating layer 13 which is exposed at the opening portion 14a, metal ions dissolved in the electroless plating solution are reduced on and deposited onto the surface of the catalyst 15, and the first electrode 161 and the third electrode 171 are formed selectively within the opening portion 14a.

Figure 6D:
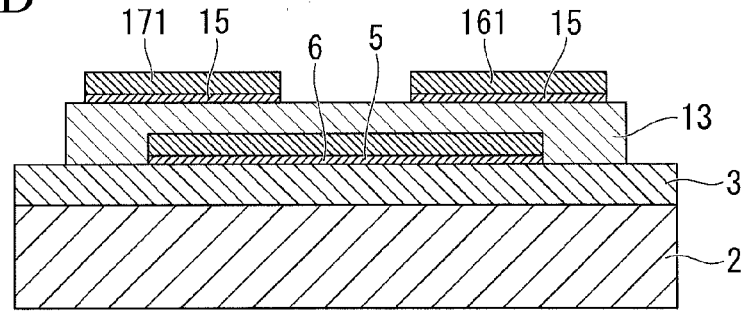
FIG. 6D is a process diagram showing the manufacturing method of the present embodiment.

Next, as is shown in FIG. 6D, after exposing the whole surface of the remaining resist layer with ultraviolet light, the resist layer is removed with a generally-known developer. In this way, the first electrode 161 and the third electrode 171 are formed.

Figure 7A:
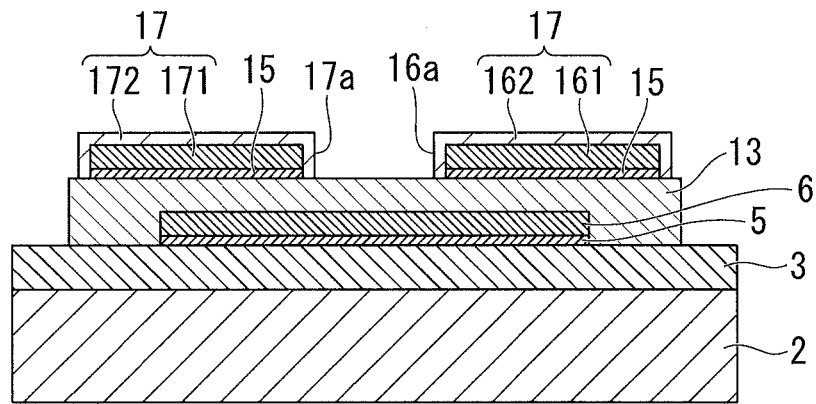
FIG. 7A is a process diagram showing the manufacturing method of the present embodiment.

Next, as is shown in FIG. 7A, by immersing the entirety of the sample in a displacement gold plating bath to cause displacement deposition of gold on the surface of the first electrode 161 and the third electrode 171, and further immersing in a reduction gold plating bath, the second electrode 162 and the fourth electrode 172 of which the formation material is gold are formed onto the surfaces of the first electrode 161 and the third electrode 171. In this way, the source electrode 16 and the drain electrode 17 are formed.

Figure 7B:
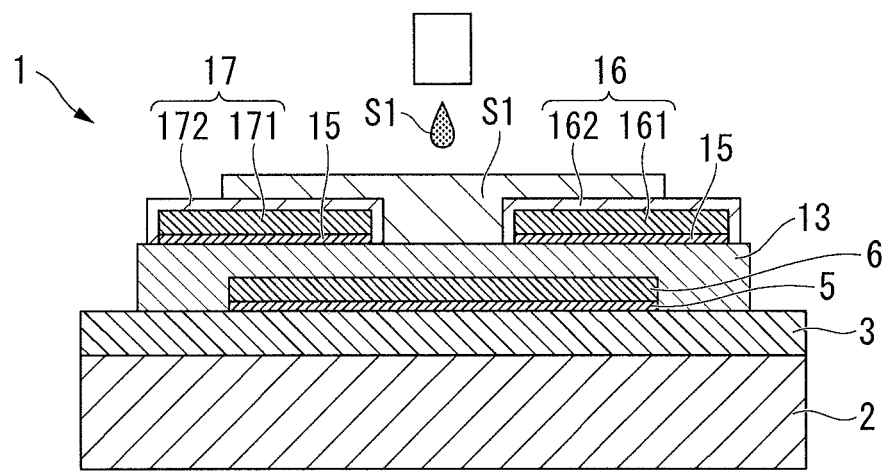
FIG. 7B is a process diagram showing the manufacturing method of the present embodiment.

Next, as is shown in FIG. 7B, by applying a solution S1 dissolving an organic semiconductor which is soluble in an organic solvent, such as TIPS pentacene, to between the source electrode 16 and the drain electrode 17 and drying the solution S1, the organic semiconductor layer 20 is formed. Note that, the embodiment is described using an example in which the organic semiconductor layer 20 is formed by a wet method; however, a method such as a sublimation method and a transfer method can be used.

As described above, it is possible to manufacture the organic transistor 1.

According to the method for manufacturing an organic transistor configured as above, because the resist layer 14 is preliminarily removed before formation of the second electrode 162 and the fourth electrode 172, it is possible to reliably form the second electrode 162 and the fourth electrode 172 even at the side surface 16a of the source electrode 16 and the side surface 17a of the drain electrode 17. Therefore, it is possible to easily manufacture a high-performance organic transistor 1 having a reduced contact resistance between the organic semiconductor layer 20 and the source electrode 16, the drain electrode 17. Moreover, the manufacturing method of the present embodiment is effective for increasing the size of a substrate and mass production of a transistor because the electrode is formed using a wet process and thereby a vacuum process is not required, and because a costly SAMs material is not used.

Note that, the present embodiment is described using an example of a bottom-gate type organic transistor of which the gate electrode is disposed at the substrate side than the source and drain electrodes; however, the configuration is not limited thereto, and is applicable to a top-gate type organic transistor.

While exemplary embodiments according to the present invention have been described as above with reference to the accompanying drawings, it should be understood that the present invention is not limited to the embodiments described above. The shapes of each constitution member shown in the above-described embodiments, combination, or the like, is an exemplary example, and a variety of modifications can be made on the basis of design requirements or the like without departing from the scope of the present invention.

For example, a PET substrate is used as a substrate, a plurality of members for plating having a parent plating layer formed on the substrate are prepared, and while transporting the plurality of members for plating and using the above-described manufacturing method in the transportation process, an organic transistor is manufactured. Thereby, it is possible to form a high-performance organic transistor on a PET substrate.

Moreover, it is possible to form an organic transistor on a PET film in a so-called roll-to-roll process in which a long PET film is used as a substrate, a member for plating having a parent plating layer formed on the film is rolled up in a roll shape in advance, the member for plating is wound off and transported, organic transistors are continuously formed by using the above-described manufacturing method, and then the manufactured organic transistors are rolled up in a roll shape.

In the case that an organic transistor is manufactured using such a process, because the alumina particles contained in the parent plating layer is as small as 100 nm or less in the manufacturing method described above, the member for plating shows high transparency and also the parent plating layer shows high followability in the case that the film is rolled up in a roll shape, cracking or exfoliation of the parent plating layer does not easily occur. Therefore, it becomes possible to manufacture a high-quality organic transistor with high productivity.

EXAMPLE

Hereinafter, the present invention is described using examples; however, the present invention is not limited to these examples.

[Preparation of Gate Electrode]

First, by using colloidal alumina particles (manufactured by Aldrich Company) as alumina particles and using an ultraviolet curable type acrylic resin (Art Resin UN-3220HA, manufactured by Negami Chemical Industrial Co., Ltd.) as a binder, a methanol dispersion solution (hereinafter, coating solution) was prepared.

Figure 8:
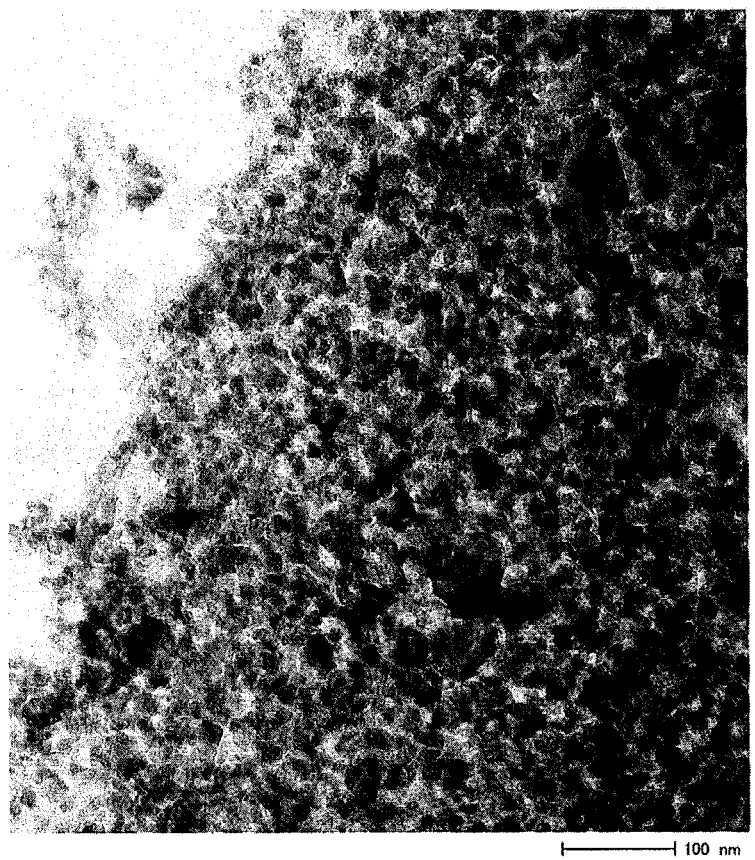
FIG. 8 is a photograph showing a result of the example.

FIG. 8 is a TEM image of the colloidal alumina particles used in the present example, and separately it was confirmed that the particles were granular nanoparticles having a volume average particle size of about 20 nm by using a measurement apparatus of which the measurement principle is a dynamic light scattering method.

The concentration of the alumina to the binder in the coating solution was defined by a volume ratio (vol %), and was adjusted in consideration of the density of the alumina and the binder. In the present example, a density of 3.97 g/cm$^3$ was used as the density of the alumina and a density of 1.19 g/cm$^3$ was used as the density of the binder, the volume concentration was converted into a weight concentration by using these values, and by mixing a 2 wt % methanol dispersion solution of the alumina and a 2 wt % methanol solution of the binder, the coating solution was prepared. In addition, the coating solution was used by adding a 3 wt % polymerization initiator (irgacure1173, manufactured by Ciba Specialty Chemicals) to the binder.

In the present example, a coating solution of which the concentration of the alumina to the binder was 5 vol % was prepared and was used for formation of a parent plating layer. In other words, the above-identified coating solution was applied to a 50 mm×50 mm square PET substrate (model number: A-4100 (without coat), manufactured by Toyobo Co., Ltd.), was dried, and then was cured by being irradiated with ultraviolet light, and the plating layer was formed.

In detail, after the coating solution was applied onto the substrate by spin coating (3000 rpm×30 seconds) and was dried, the sample was irradiated with 365 nm ultraviolet light at a condition of radiation illuminance: 37 mW/cm$^2$ and irradiation time: 40 seconds (dose: 1480 mJ/cm$^2$) using an ultraviolet light irradiation apparatus (Multilight, manufactured by Ushio Inc.). Then, heating was performed at 120° C. for 30 minutes, and the parent plating layer was formed.

Next, by applying a resist material (SUMIRESIST PFI-34A6, manufactured by Sumitomo Chemical Co., Ltd.) with spin coating onto the surface of the substrate on which the parent plating layer was formed, and by heating (prebaking) at 90° C. for 30 minutes, a resist layer was formed. The spin coating was performed at 1000 rpm for 30 seconds, and a resist layer of a thickness of about 1 μm was formed.

Next, by exposing with ultraviolet light of an intensity of 37 mW/cm$^2$ for 2.8 seconds via a photomask, heating (post baking) at 110° C. for 30 minutes, and then immersing in a 2.38% TMAH solution for 2 minutes, the mask pattern was developed on the resist layer, and an opening portion was formed.

Next, after performing ultrasonic water cleaning at room temperature for 30 seconds with respect to the substrate in which the opening portion of the resist layer was formed, the substrate was immersed in a catalyst colloidal solution for electroless plating (Melplate activator 7331, manufactured by Meltex Inc.) at room temperature for 300 seconds, and a catalyst was adhered to the parent plating layer which was exposed at the opening portion of the resist layer.

Next, after cleaning the surface with water, the sample was immersed in an activation reagent of a catalyst for electroless plating (Melplate PA-7340, manufactured by Meltex Inc.) at room temperature for 180 seconds, and the catalyst adhered to the opening portion of the resist layer was activated.

Next, after cleaning the surface with water, the sample was immersed in an electroless plating solution (Melplate NI-867, manufactured by Meltex Inc.) at 73° C. for 60 seconds, and nickel-phosphorus was deposited onto the catalyst adhered to the opening portion of the resist layer, thus nickel-phosphorus plating was performed.

Next, the surface was cleaned with water and then dried, and the whole surface including the remaining resist layer was exposed with ultraviolet light of an intensity of 37 mW/cm$^2$ for 1 minute. Then, by immersing in a NaOH aqueous solution having a concentration of 50 g/L for 2 minutes, the resist layer was removed, and a gate electrode was prepared.

Figure 9A:
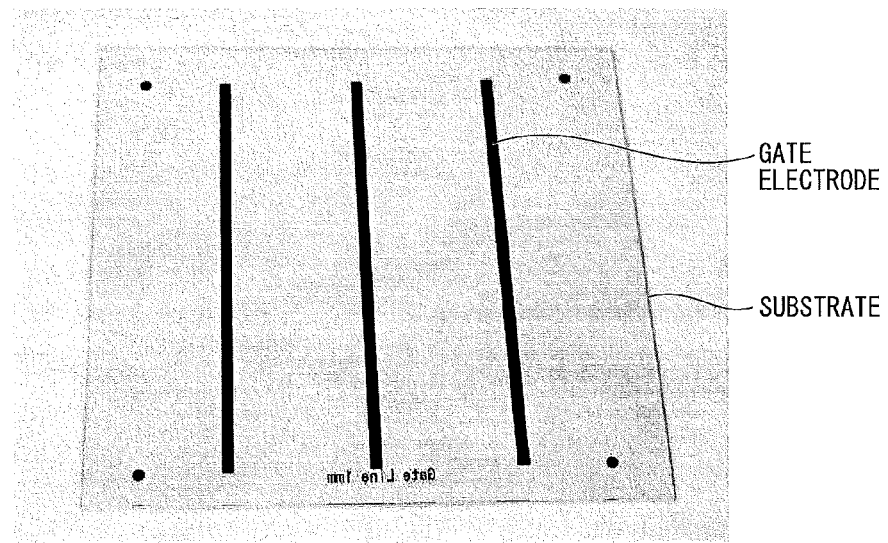
FIG. 9A is a photograph showing a result of the example.
Figure 9B:
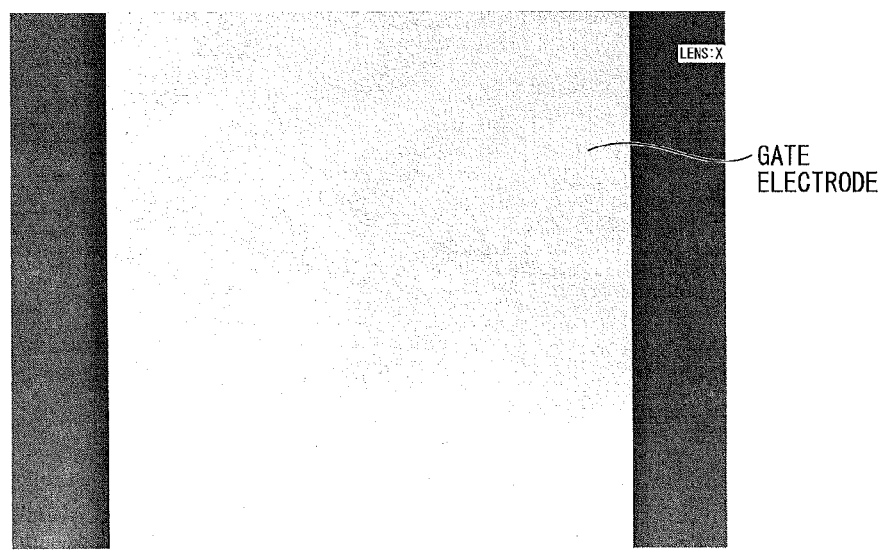
FIG. 9B is a photograph showing a result of the example.

FIG. 9A is a photograph of the prepared gate electrode, and FIG. 9B is a magnified photograph of the gate electrode. It was found that a flat gate electrode with little unevenness was formed.

[Preparation of Insulator Layer]

A solution of a silane coupling agent (KBE903, manufactured by Shin-Etsu Silicone Company) diluted by a mixed solvent of ethanol and water into 0.05 wt % was applied by spin coating to the whole surface at the side where the gate electrode was formed in the PET substrate.

Next, after heating at 120° C. for 5 minutes, the next coating solution was applied by spin coating. The spin coating was performed at 800 rpm for 30 seconds.

Using a 1:1 mixed solution of a 10 wt % methanol solution of the binder and a 10 wt % PGMEA solution of the binder, a 10 wt % methanol dispersion solution of the colloidal alumina (manufactured by Aldrich Company) was diluted, and the coating solution was prepared. The content rate of the alumina to the binder was 5 vol %. An ultraviolet curable type acrylic resin (Art Resin UN-32201HA, manufactured by Negami Chemical Industrial Co., Ltd.) was used as the binder, and the above-described polymerization initiator was added by 3 wt %.

After the above-identified coating solution was applied and dried, the sample was irradiated with 365 nm ultraviolet light via a photomask at a condition of radiation illuminance: 37 mW/cm$^2$ and irradiation time: 40 seconds. Next, after heating at 120° C. for 2 minutes, an ultrasonic process was performed for 10 seconds while immersing the whole substrate into acetone to perform development, and furthermore, heating was performed at 120° C. for 30 minutes. Thereby, a plating layer which functioned as an insulator layer was formed.

Figure 10A:
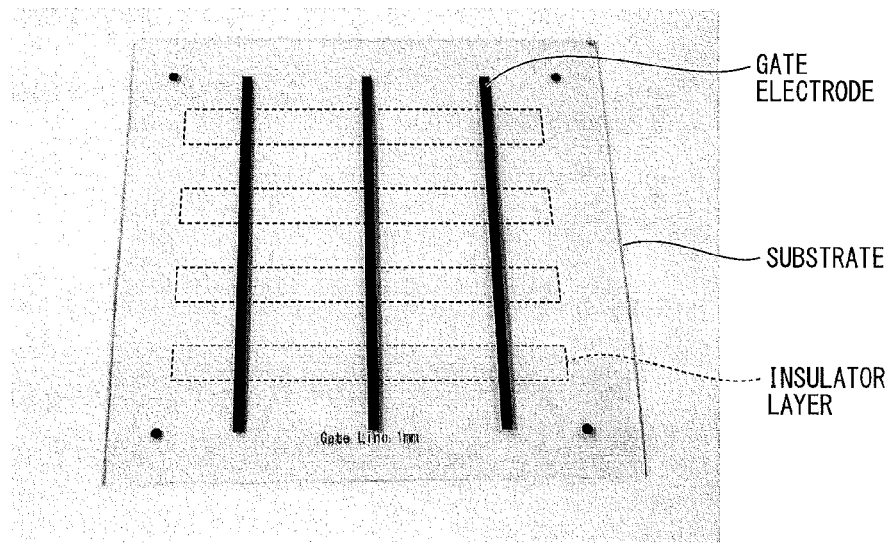
FIG. 10A is a photograph showing a result of the example.
Figure 10B:
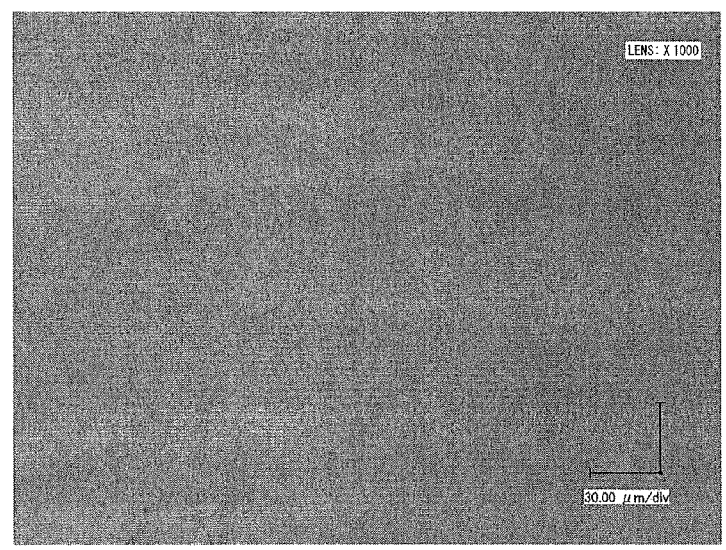
FIG. 10B is a photograph showing a result of the example.

FIG. 10A is a photograph of a substrate in which an insulator layer is formed, and FIG. 10B is a magnified photograph of the insulator layer within a region surrounded by a dashed line of FIG. 10A. As a result of observation, the filler was sufficiently dispersed in the insulator layer, and aggregates or the like were not identified. In addition, the thickness of the insulator layer was measured by a step measurement apparatus, and the film thickness was about 350 nm.

[Preparation of Source and Drain Electrodes]

Next, on the whole of the surface on which the insulator layer was formed in the PET substrate, a resist layer was prepared and electroless plating was performed using the method described above. Thereby, a patterned NiP electrode was formed on the insulator layer. The NiP electrode corresponds to the first electrode and the third electrode described in the embodiment.

Moreover, after removing the resist, electroless gold plating was performed by immersing the sample in a displacement gold plating bath for 2 minutes, and further immersing in a reduction plating bath for 3 minutes. Thus, the surface of the NiP electrode was covered by gold, and a source electrode and a drain electrode were prepared.

Figure 11:
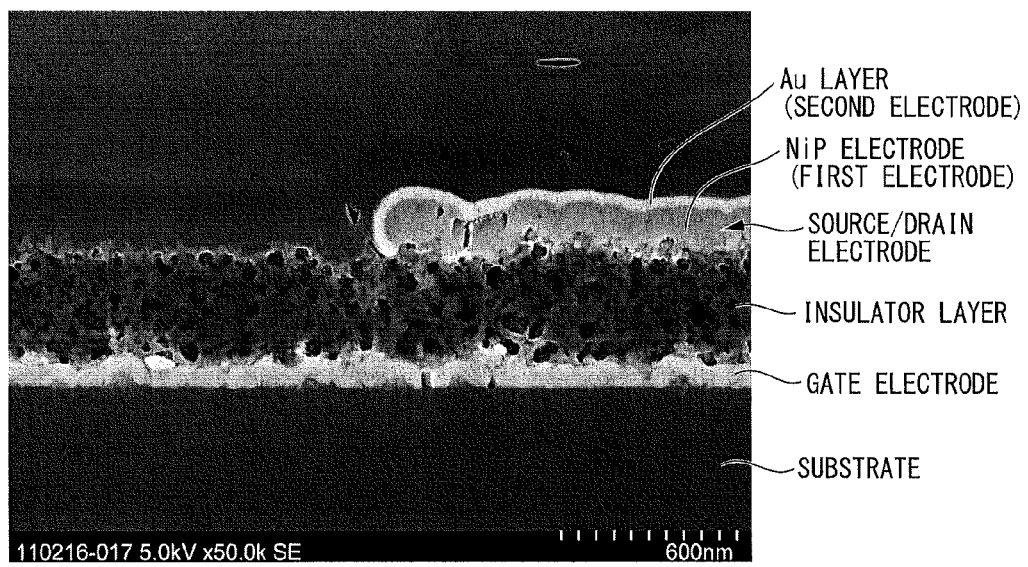
FIG. 11 is a photograph showing a result of the example.

FIG. 11 is a cross-sectional SEM image of a multilayer wiring structure fabricated by the above-identified procedure. By the cross-sectional SEM image, it was observed that the source and drain electrodes were constituted by two layers and that the surface of the NiP electrode was successfully covered by gold.

In addition, the conduction between the gate electrode and the source and drain electrodes was measured using a tester. As a result, a leak current was not identified. Therefore, it was confirmed that the plating layer of the present example was usable also as an insulator layer.

[Preparation of Organic Semiconductor Layer]

In nitrogen atmosphere, a toluene solution of TIPS pentacene (manufactured by Sigma Aldrich) was dropped between the source electrode and the drain electrode, and was dried naturally. Thereby, an organic semiconductor layer was formed, and an organic transistor was prepared. The preparation of the used TIPS pentacene/toluene solution was also performed in nitrogen atmosphere.

Figure 12:
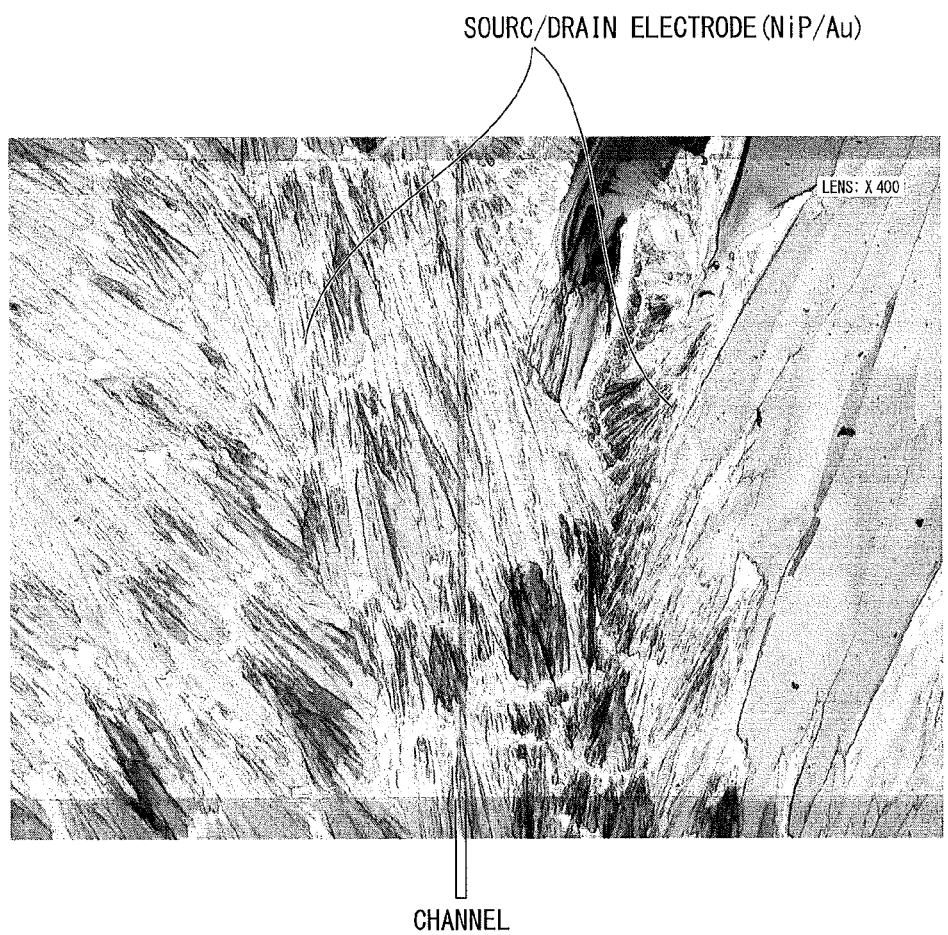
FIG. 12 is a photograph showing a result of the example.

FIG. 12 is a magnified photograph of the source electrode and the drain electrode having a surface on which an organic semiconductor layer was formed. It was observed that the crystal of TIPS pentacene was formed between the source electrode and the drain electrode.

[Evaluation of Organic Transistor]

The transistor characteristics of the prepared organic transistor were measured using a semiconductor parameter analyzer (model number: 4145B, manufactured by Yokogawa-Hewlett-Packard Ltd.).

Figure 13:
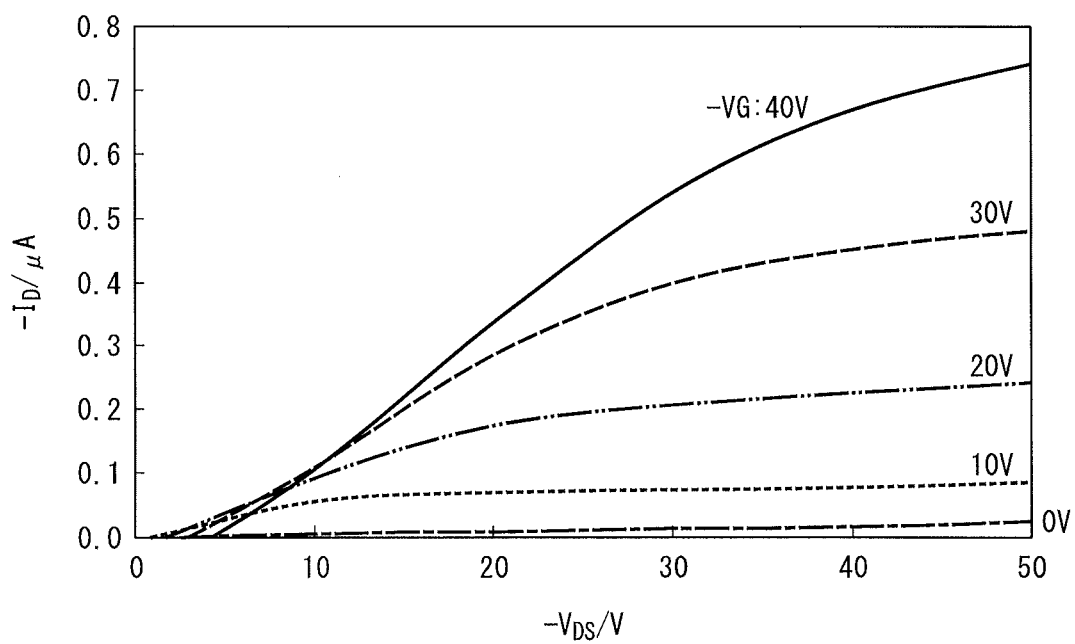
FIG. 13 is a graph showing a result of the example.

FIG. 13 is a graph showing the transistor characteristics of the organic transistor fabricated by a wet process using the method described above.

A gate voltage of 0 V to 40 V was applied to the gate electrode of the obtained organic thin film transistor and a voltage of 0 V to 50 V was applied between the source and the drain, and a current was flowed. As a result, as is shown in the figure, the fabricated organic transistor operated as a p-type transistor.

From the results described above, it was found that it is possible to prepare an organic transistor by an all-wet process. In addition, using an electroless plating method, it is possible to cover the whole surface of the source and drain electrodes by a metal material having a work function with a small energy gap with the HOMO of the formation material of the organic semiconductor layer. Therefore, it is possible to provide an organic transistor having a small electric contact resistance between the organic semiconductor layer and the source and drain electrodes.

From the results described above, the usefulness of the present invention was confirmed.

In an embodiment of the present invention, a method for manufacturing a transistor includes: forming a base film for supporting a catalyst for electroless plating; forming a resist layer having an opening portion corresponding to a source electrode and a drain electrode onto the base film; causing the base film within the opening portion to support the catalyst for electroless plating and performing a first electroless plating; removing the resist layer; performing a second electroless plating on a surface of an electrode which is formed by the first electroless plating and forming a source electrode and a drain electrode; and forming a semiconductor layer in contact with a surface of the source electrode and a surface of the drain electrode, the surfaces facing each other, wherein an energy level difference between a work function of a metal material which is used for the second electroless plating and an energy level of a molecular orbital which is used for electron transfer in a formation material of the semiconductor layer is less than an energy level difference between a work function of a metal material which is used for the first electroless plating and the energy level of the molecular orbital.

In the above embodiment, for example, the semiconductor layer can be constituted by an organic semiconductor.

In addition, in the above embodiment, for example, a solution in which a formation material of the semiconductor is dissolved can be placed, and the semiconductor layer can be formed.

In addition, in the above embodiment, for example, the base film can include: a base material constituted by a photo curable resin; and alumina particles of which an average particle size is 100 nm or less, wherein the base film can be selectively formed by placing a solution which includes a precursor of the base material and the alumina particles and selectively performing light irradiation.

In addition, in the above embodiment, for example, the photo curable resin can be an ultraviolet curable resin.

In addition, in the above embodiment, for example, the transistor can be formed on a substrate constituted by a non-metal material.

In addition, in the above embodiment, for example, the transistor can be formed on a substrate constituted by a resin material.

In addition, in the above embodiment, for example, the substrate can have flexibility.

In another embodiment of the present invention, a transistor includes: a source electrode and a drain electrode; a gate electrode that is provided corresponding to a channel between the source electrode and the drain electrode; and a semiconductor layer that is provided in contact with a surface of the source electrode and a surface of the drain electrode, the surfaces facing each other, wherein: the source electrode has a first electrode and a second electrode that is provided on at least part of a surface of the first electrode; the drain electrode has a third electrode and a fourth electrode that is provided on at least part of a surface of the third electrode; an energy level difference between a work function of a formation material of the second electrode and an energy level of a molecular orbital which is used for electron transfer in a formation material of the semiconductor layer is less than an energy level difference between a work function of a formation material of the first electrode and the energy level of the molecular orbital; and an energy level difference between a work function of a formation material of the fourth electrode and an energy level of a molecular orbital which is used for electron transfer in a formation material of the semiconductor layer is less than an energy level difference between a work function of a formation material of the third electrode and the energy level of the molecular orbital.

In the above embodiment, for example, the first electrode and the third electrode can be constituted by the same material.

In addition, in the above embodiment, for example, the second electrode and the fourth electrode can be constituted by the same material.

In addition, in the above embodiment, for example, the semiconductor layer can be constituted by an organic semiconductor.

What is claimed is:

1. A method for manufacturing a transistor, the method comprising:

forming a base film for supporting a catalyst for electroless plating;

forming a resist layer having an opening portion onto the base film, the opening portion having first and second openings corresponding to a source electrode and a drain electrode, respectively;

causing the base film within the opening portion to support the catalyst for electroless plating and performing a first electroless plating to form electrodes respectively in the first and second openings;

removing the resist layer;

after the removing the resist layer, performing a second electroless plating on a surface of each of the electrodes formed by the first electroless plating, thereby forming a source electrode and a drain electrode; and forming a semiconductor layer in contact with a surface of the source electrode and a surface of the drain electrode, the surfaces facing each other, wherein an energy level difference between a work function of a metal material which is used for the second electroless plating and an energy level of a molecular orbital which is used for electron transfer in a formation material of the semiconductor layer is less than an energy level difference between a work function of a metal material which is used for the first electroless plating and the energy level of the molecular orbital.

2. The method for manufacturing a transistor according to claim 1, wherein the semiconductor layer is constituted by an organic semiconductor.

3. The method for manufacturing a transistor according to claim 2, wherein a solution in which a formation material of the organic semiconductor is dissolved is placed, and the semiconductor layer is formed.

4. The method for manufacturing a transistor according to claim 1, wherein the base film includes: a base material constituted by a photo curable resin; and alumina particles of which an average particle size is 100 nm or less, wherein the base film is selectively formed by placing a solution which includes a precursor of the base material and the alumina particles and selectively performing light irradiation.

5. The method for manufacturing a transistor according to claim 4, wherein the photo curable resin is an ultraviolet curable resin.

6. The method for manufacturing a transistor according to claim 1, wherein the transistor is formed on a substrate constituted by a non-metal material.

7. The method for manufacturing a transistor according to claim 1, wherein the transistor is formed on a substrate constituted by a resin material.

8. The method for manufacturing a transistor according to claim 7, wherein the substrate has flexibility.

* * * * *